United States Patent
Matsumoto et al.

(10) Patent No.: US 8,242,015 B2
(45) Date of Patent: Aug. 14, 2012

(54) FILM FORMING METHOD AND FILM FORMING APPARATUS

(75) Inventors: Kenji Matsumoto, Nirasaki (JP); Hitoshi Itoh, Nirasaki (JP); Koji Neishi, Sendai (JP); Junichi Koike, Sendai (JP)

(73) Assignees: Tokyo Electron Limited, Tokyo (JP); Tohoku University, Sendai-shi (JP)

( * ) Notice: Subject to any disclaimer, the term of this patent is extended or adjusted under 35 U.S.C. 154(b) by 46 days.

(21) Appl. No.: 12/631,556

(22) Filed: Dec. 4, 2009

(65) Prior Publication Data
US 2010/0140802 A1    Jun. 10, 2010

Related U.S. Application Data

(63) Continuation of application No. PCT/JP2008/060159, filed on Jun. 2, 2008.

(30) Foreign Application Priority Data

Jun. 4, 2007 (JP) ................................. 2007-148553
Dec. 15, 2007 (JP) ................................. 2007-324098

(51) Int. Cl.
*H01L 21/4763* (2006.01)

(52) U.S. Cl. . 438/627; 438/618; 257/751; 257/E21.584; 257/E21.586

(58) Field of Classification Search .................. 438/627, 438/618, 653, 643, 687; 257/751, E21.584, 257/E23.161, E21.586
See application file for complete search history.

(56) References Cited

U.S. PATENT DOCUMENTS

| | | | |
|---|---|---|---|
| 6,924,316 B2* | 8/2005 | Iwamoto et al. | 518/717 |
| 6,987,059 B1* | 1/2006 | Burke et al. | 438/627 |
| 7,064,224 B1 | 6/2006 | Lei et al. | |
| 7,413,977 B2* | 8/2008 | Shimizu et al. | 438/637 |
| 2005/0106865 A1 | 5/2005 | Chung et al. | |
| 2005/0218519 A1 | 10/2005 | Koike et al. | |
| 2006/0037858 A1 | 2/2006 | Marumo et al. | |
| 2007/0048931 A1 | 3/2007 | Shimizu et al. | |
| 2009/0043119 A1 | 2/2009 | Sekimoto et al. | |

FOREIGN PATENT DOCUMENTS

| | | |
|---|---|---|
| JP | 11-200048 | 7/1999 |
| JP | 2004-107747 | 4/2004 |

(Continued)

OTHER PUBLICATIONS

G.A. Rizzi, et al., "Epitaxial growth of MnO nanoparticles on Pt (111) by reactive deposition of $Mn_2(CO)_{10}$", Surface Science, vol. 462, 2000, pp. 187-194.

(Continued)

*Primary Examiner* — David Vu
(74) *Attorney, Agent, or Firm* — Oblon, Spivak, McClelland, Maier & Neustadt, L.L.P.

(57) ABSTRACT

On a surface of an object to be treated, a Mn-containing thin film or CuMn-containing alloy thin film is formed by heat treatment (CVD or ALD) by using a Mn-containing source gas (or Mn-containing source gas and a Cu-containing gas) and an oxygen-containing gas (for instance, water vapor) as a processing gas. The Mn-containing thin film or the CuMn-containing alloy thin film can be formed with high step coverage in a fine recess formed on the surface of the object to be treated.

19 Claims, 14 Drawing Sheets

FOREIGN PATENT DOCUMENTS

| | | |
|---|---|---|
| JP | 2005-277390 | 10/2005 |
| JP | 2006-73863 | 3/2006 |
| JP | 2006-257073 | 9/2006 |
| JP | 2007-502551 | 2/2007 |
| JP | 2007-67107 | 3/2007 |
| JP | 2007-84522 | 4/2007 |

OTHER PUBLICATIONS

Mikko Ritala, et al., "Atomic Layer Deposition", Handbook of Thin Film Materials, vol. 1, Chapter 2, 2002, pp. 103-159.

R. Delsol, et al., "Improved electrical and reliability performance of 65 nm interconnects with new barrier integration schemes", Microelectronic Engineering, vol. 83, 2006, pp. 2377-2380.

* cited by examiner

Mn-CONTAINING FILM OR
CuMn-CONTAINING ALLOY FILM

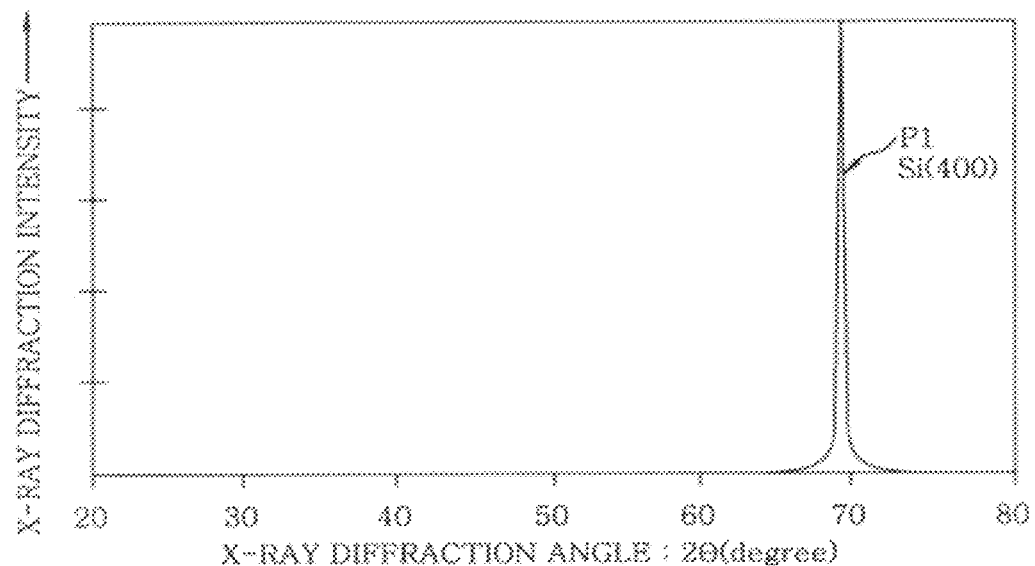
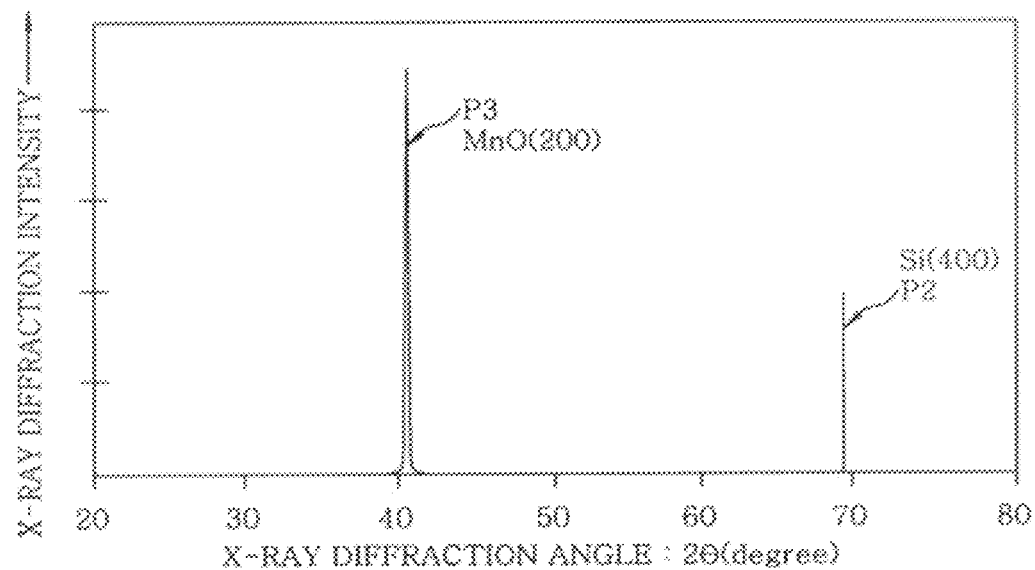

FILM FORMING METHOD AND FILM FORMING APPARATUS

This application is a Continuation Application of PCT International Application No. PCT/JP2008/060159 filed on Jun. 2, 2008, which designated the United States.

FIELD OF THE INVENTION

The present invention relates to a film forming method and a film forming apparatus for forming a manganese (Mn) containing film or a copper-manganese (CuMn) containing alloy film, as a seeding film, on a surface of an object to be treated such as a semiconductor wafer.

BACKGROUND OF THE INVENTION

In general, in order to manufacture semiconductor devices, a semiconductor wafer is repeatedly subjected to various treatments such as a film forming process and a pattern etching process to form desired devices. With increased requirements for highly integrated and miniaturized semiconductor devices, a line width and/or a hole diameter of the device is currently being reduced. Along with reduction in various dimensions of the device, a lower electric resistance is required. In order to meet the requirement, copper with economic merit and low electric resistance tends to be used as a wiring material and/or a material buried in recess such as trenches, holes, and the like (see, e.g., Japanese Laid-open Publication No. 2004-107747 and corresponding U.S. Patent Application Publication No. 2006-037858). When copper is used as the wiring material and/or the buried material, a tantalum metal (Ta) or a tantalum nitride (TaN) film is generally used as a barrier layer in consideration of diffusion barrier properties of copper to a layer thereunder.

In order to bury copper in a recess, first of all, a thin seeding film of a pattern film is formed on the entire surface of a wafer including an entire wall surface of the recess in a plasma sputtering apparatus. Then, copper plating is performed on the entire surface of the wafer to completely bury copper in the recess. Afterwards, a residual copper thin film remaining on the wafer surface is polished and removed by chemical mechanical polishing (CMP).

Referring to FIGS. 12A to 12C, burying of copper will be described in detail below. FIGS. 12A to 12C illustrate a conventional burying process for a recess of a semiconductor device. An insulating layer 1, e.g., an interlayer insulating film, formed on a semiconductor wafer W has a recess 2 corresponding to a via hole, through hole, groove (trench or dual damascene structure) or the like on the surface thereof. A lower wiring layer 3 made of, e.g., copper is exposed on the bottom of the recess 2.

Specifically, the recess 2 includes a long and narrow groove (trench) 2A and a hole 2B formed at a part of the bottom of the groove 2A. The hole 2B may be a contact hole or a through hole. The wiring layer 3 is exposed on the bottom of the hole 2B (FIG. 12A shows the wiring layer 3 covered with a barrier layer 4). The electrical connection with a lower wiring layer and/or another device such as a transistor is made through the wiring layer 3. Illustration of the lower wiring layer and/or the device such as a transistor is omitted from the drawing.

The insulating layer 1 may be formed of, e.g., an $SiO_2$ film. A width or an inner diameter of the recess 2 is drastically reduced to about 120 nm and an aspect ratio of the recess 2 may range from about 2 to 4 in response to design rules for miniaturization of devices. Further, illustration of a diffusion barrier film and an etching stopper film will be omitted for simplicity.

A barrier layer 4 with a stack structure of, e.g., a TaN film and a Ta film is pre-formed on a surface of the semiconductor wafer W (including an inner surface of the recess 2) by using the plasma sputtering apparatus (see FIG. 12A). Then, a seeding film 6 of a thin copper film is formed on the entire surface of the semiconductor wafer W (including the inner surface of the recess 2) by using another plasma sputtering apparatus (see FIG. 12B). When the seeding film 6 is formed by the plasma sputtering apparatus, a high frequency bias power is applied to the semiconductor wafer and introduction of copper ions is efficiently performed. Next, copper plating is performed on the surface of the wafer to bury a metal film 8 of a copper film in the recess 2 (see FIG. 12C). Afterwards, undesired portions of the metal film 8, the seeding film 6 and the barrier layer 4 remaining on the surface of the wafer are eliminated by a polishing process such as CMP.

However, a variety of investigations into development of a barrier layer with improved reliability are currently conducted and, in particular, a self-formable barrier layer using a Mn film or a CuMn alloy film instead of Ta and/or TaN films has been receiving attention (see Japanese Laid-open Publication No. 2005-277390 and corresponding U.S. Patent Application Publication No. 2005-218519). The Mn film (or CuMn alloy film) is formed by sputtering. Since the Mn film (or CuMn alloy film) becomes a seeding film, a Cu plated layer may be formed directly on the seeding film. Further, annealing the film after Cu plating induces a self-alignment reaction of the Mn film (or CuMn alloy film) with an $SiO_2$ layer serving as an insulating layer below the Mn film (or CuMn alloy film), thereby forming a barrier film at a boundary between the $SiO_2$ layer and the Mn film (or CuMn alloy film), wherein the barrier film is formed of a $MnSi_xO_y$ film (x, y: random positive) and/or a manganese oxide $MnO_x$ (x: random positive). Therefore, the number of manufacturing processes is preferably reduced. The manganese oxide includes oxides of manganese with different atomic valences, e.g., $MnO$, $Mn_3O_4$, $Mn_2O_3$, and $MnO_2$, and will be hereinafter referred to as $MnO_x$.

In practical applications, the Mn film (CuMn alloy film) is only formed by sputtering. Since step coverage attained by a sputtering method has restrictions, the sputtering method may hardly conform with film formation in a future device with an extremely fine pattern, e.g., formation of a film in a trench and/or hole of the device wherein a line width and/or a hole diameter of the trench and/or hole is equal to or smaller than 32 nm.

Furthermore, formation of the seeding film 6 (Mn film or CuMn alloy film), Cu plating and/or annealing must employ respective apparatuses suitable for individual processes, that is, a sputtering apparatus, an electroplating apparatus and an annealing apparatus, respectively. Accordingly, an increase in total installation costs (equipment costs) cannot be avoided.

As for formation of a Mn film (CuMn alloy film) by sputtering, a thick film is formed on the bottom of a recess rather than a sidewall thereof. Therefore, even if a sufficiently thin $MnSi_xO_y$ film is generated on the sidewall of the recess after an annealing process, a large amount of Mn or $MnO_x$ with higher resistance than copper remains on the bottom of the recess. As a result, the film has a problem of high contact resistance.

SUMMARY OF THE INVENTION

Therefore, the present invention has been made in view of the above problems, and it is an object of the present invention to provide a film forming method and apparatus for forming a Mn-containing film or a CuMn-containing alloy film by heat treatment such as CVD with advantages such that the film can be formed in a fine recess with high step coverage and continuous treatments can be carried out in the same apparatus, thereby considerably reducing installation costs.

The inventors of the present invention have discovered that the film formation can be efficiently performed while reducing an incubation time and drastically raising a film forming speed by using water vapor ($H_2O$) during formation of a Mn-containing film or a CuMn-containing alloy film, thereby completing the present invention.

In accordance with a first aspect of the present invention, there is provided a film forming method, comprising forming a thin film on a surface of an object to be treated by heat treatment by using a transition metal-containing source gas containing a transition metal and an oxygen-containing gas in a vacuum-evacuable processing chamber.

In the film forming method of the first aspect, an oxygen-containing gas and a transition metal-containing source gas are used to form a thin film on a surface of a substrate by heat treatment in a vacuum-evacuable processing chamber, so that an incubation time can be shortened while maintaining a high film forming speed and the film formation can be performed with high step coverage even in a fine recess. Moreover, the same processing apparatus can be repeatedly used for continuous treatments, thus considerably reducing overall installation costs.

In accordance with a second aspect of the present invention, there is provided a film forming method, comprising forming a thin film on a surface of an object to be treated by heat treatment by using a transition metal-containing source gas containing a transition metal, a copper-containing source gas and an oxygen-containing gas in a vacuum-evacuable processing chamber.

In the film forming method of the second aspect, a transition metal-containing source gas, a copper-containing source gas and an oxygen-containing gas are used to form a thin film on a surface of a substrate by heat treatment in a vacuum-evacuable processing chamber, so that an incubation time can be shortened while maintaining a high film forming speed and the film formation can be performed with high step coverage even in a fine recess. Moreover, the same processing apparatus can be repeatedly used for continuous treatments, thus considerably reducing overall installation costs.

The heat treatment may be performed by chemical vapor vapor-deposition (CVD) or atomic layer deposition (ALD).

In case of using the transition metal-containing source gas and the copper-containing source gas, the film forming method may comprise a first step including supplying the transition metal-containing gas and supplying the oxygen-containing gas; and a second step including supplying the copper-containing gas and supplying the oxygen-containing gas, wherein the first step and the second step are alternately repeated to form the thin film.

After the thin film is formed by the heat treatment, a punch-through treatment may be performed to remove the thin film present on a bottom of the recess. The punch-through treatment may be an etching process performed after the surface of the object excluding a part to be removed is covered with a resist. Alternatively, the punch-through treatment may be an etching process performed to entirely etch back the surface of the object. When the recess includes a groove and a hole formed on a bottom of the groove, the thin film removed by the punch-through treatment may be a thin film present on a bottom of the hole.

A copper film may be deposited on the object having the thin film formed thereon by CVD to perform a burying process in the recess of the object. The burying process may be conducted in the processing chamber in which the thin film was formed. Accordingly, the processes can be continuously performed in the same apparatus (in-situ), thereby considerably reducing overall installation costs.

An annealing process may be performed on the object after the burying process. The annealing process may be performed in the processing chamber in which the burying process was conducted.

A copper film may be deposited on the object having the thin film formed thereon by a plating method to perform a burying process in a recess of the object. An annealing process may be performed on the object after the burying process.

An underlayer of the thin film may include at least one from the group consisting of an $SiO_2$ film, an SiOF film, an SiC film, an SiN film, an SiOC film, a SiCOH film, an SiCN film, a porous silica film, a porous methylsilsesquioxane film, a polyarylene film, a SiLK (registered trademark) film and a fluorocarbon film.

A material of the transition metal-containing gas may include an organic metal material or a metal complex material.

The transition metal may include manganese (Mn) and the organic metal material containing manganese may be at least one selected from the group consisting of $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_3]$, and $((CH_3)_5Cp)_2Mn[=Mn((CH_3)_5C_5H_4)_2]$.

A ratio (M1/M2) of a supply amount M1 of the transition metal-containing source gas containing Mn to a supply amount M2 of the oxygen-containing gas may range from 0.001 to 50.

The heat treatment may be conducted with a plasma.

The source gas and the oxygen-containing gas may be mixed with each other at first in the processing chamber.

The oxygen-containing gas may include at least one selected from the group consisting of $H_2O$ (water vapor), $N_2O$, $NO_2$, $NO$, $O_3$, $O_2$, $H_2O_2$, $CO$, $CO_2$ and alcohol.

In accordance with a third aspect of the present invention, there is provided a film forming apparatus for forming a thin film containing a transition metal on a surface of an object to be treated by heat treatment, comprising: a vacuum-evacuable processing chamber; a mounting table structure disposed in the processing chamber to mount the object thereon; a heating unit for heating the object; a gas introduction unit for introducing a gas into the processing chamber; a source gas supply unit for supplying a source gas to the gas introduction unit; and an oxygen-containing gas supply unit for supplying an oxygen-containing gas to the gas introduction unit.

The source gas may be a transition metal-containing source gas containing a transition metal. The source gas may include a transition metal-containing source gas containing a transition metal and a copper-containing source gas. The source gas and the oxygen-containing gas may be mixed with each other at first in the processing chamber. The oxygen-containing gas may include at least one selected from the group consisting of $H_2O$ (water vapor), $N_2O$, $NO_2$, $NO$, $O_3$, $O_2$, $H_2O_2$, $CO$, $CO_2$ and alcohol.

BRIEF DESCRIPTION OF THE DRAWINGS

The objects and features of the present invention will become apparent from the following description of embodiments, given in conjunction with the accompanying drawings, in which:

FIGS. 8A and 8B are graphs illustrating X-ray diffraction results to examine influence of $H_2O$ upon formation of the Mn-containing film;

DETAILED DESCRIPTION OF THE EMBODIMENTS

Hereinafter, a film forming method and a film forming apparatus in accordance with embodiments of the present invention will be described in detail with reference to the accompanying drawings.

First Embodiment

Figure 1:
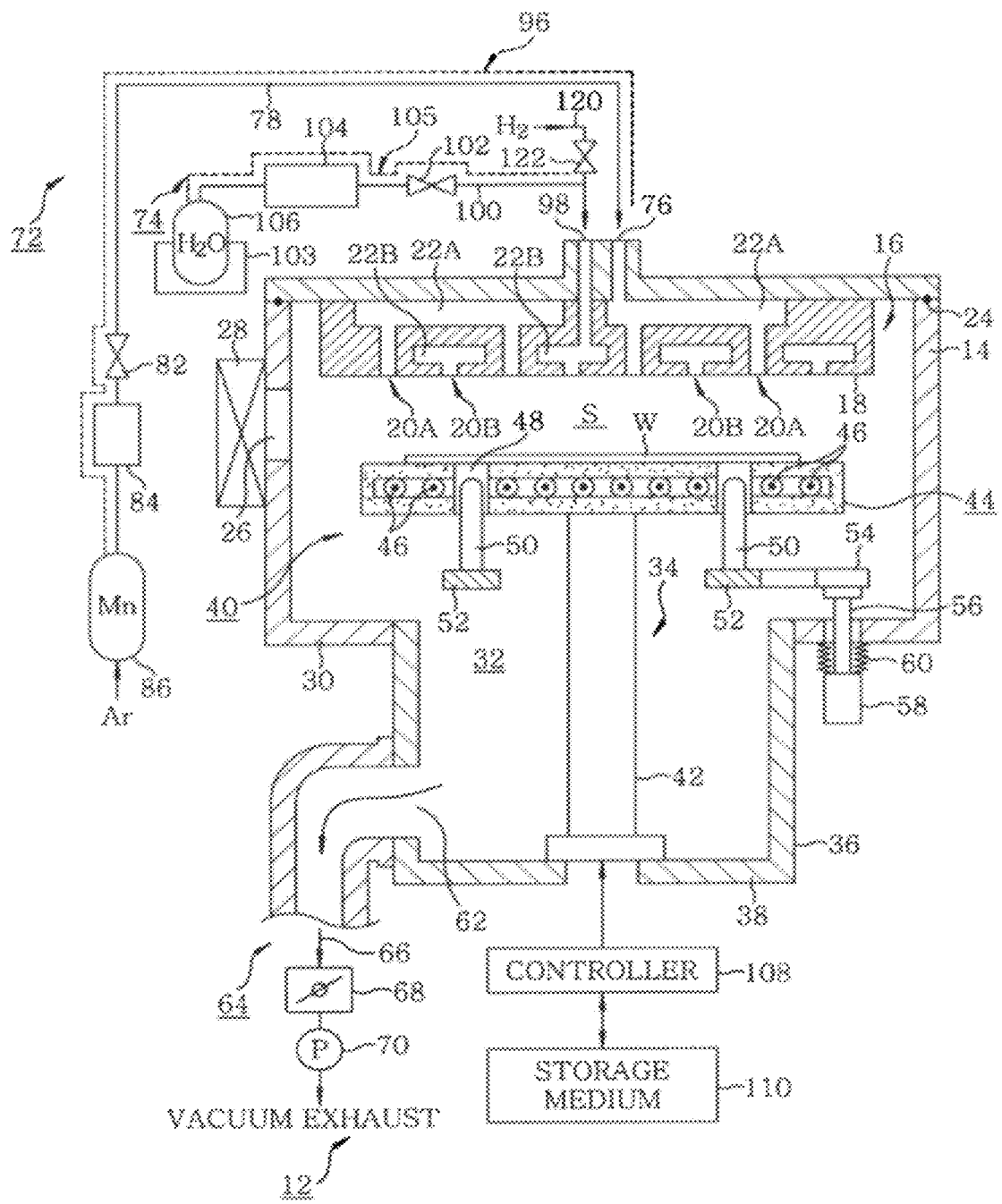
FIG. 1 illustrates a configuration of a film forming apparatus in accordance with a first embodiment of the present invention.

FIG. 1 illustrates a configuration of a film forming apparatus in accordance with a first embodiment of the present invention. The film forming apparatus in accordance with the first embodiment is used to form a Mn-containing film including a transition metal. In the following embodiments to be described below, water vapor ($H_2O$) is used as an oxygen-containing gas. As shown in FIG. 1, a film forming apparatus 12 in accordance with the embodiment of the present invention includes a processing chamber 14 made of aluminum and having an approximately cylindrical inner space. A shower head 16 serving as a gas introduction unit is provided at a ceiling of the processing chamber 14 to introduce a desired processing gas, e.g., a film forming gas. A gas injection surface 18 that is a bottom surface of the shower head 16 has a plurality of gas injection holes 20A and 20B through which the processing gas is injected to a processing space S.

Two separate gas diffusion spaces 22A and 22B are provided in the shower head 16. The processing gas supplied into the gas diffusion spaces 22A and 22B is diffused in a horizontal direction therein, then, is injected into the processing space S through the gas injection holes 20A and 20B communicating with the gas diffusion spaces 22A and 22B, respectively. The gas injection holes 20A and 20B are aligned in a matrix in its plan view. Different gases injected through the injection holes 20A and 20B are mixed with each other at first in the processing space S. Such a gas supply mode is referred to as "post mix."

The shower head 16 may be made of nickel, a nickel alloy such as hastelloy (registered trademark), aluminum or an aluminum alloy. When film formation is carried out by ALD to be described later, the shower head 16 having a single gas diffusion space may be used. A seal member 24 such as an O ring is interposed between the shower head 16 and an upper opening of the processing chamber 14 and, thus, the processing chamber 14 is airtightly sealed.

At the sidewall of the processing chamber 14, there is provided a loading/unloading port 26 through which a semiconductor wafer W serving as an object to be treated is loaded into and unloaded from the processing chamber 14. The loading/unloading port 26 is provided with a gate valve 28 to hermetically seal the loading/unloading port 26.

A gas exhaust space 32 is connected to a bottom portion 30 of the processing chamber 14. Specifically, a large opening 34 is formed in the center of the bottom portion 30 and is connected to a cylindrical body 36 extending downward and having a bottom portion 38. An inner space of the cylindrical body 36 forms the gas exhaust space 32. A mounting table structure 40 is placed at the bottom portion 38 of the cylindrical body 36. The mounting table structure 40 includes a cylindrical pillar 42 vertically standing from the bottom portion 38 and a mounting table 44 fixed to an upper end of the pillar 42 to mount thereon the semiconductor wafer W serving as an object to be treated.

The mounting table 44 is made of, e.g., a ceramic material or quartz glass. A resistance heater 46 formed of, e.g., a carbon wire heater to generate heat by electrical conduction is disposed inside the mounting table 44 to heat the semiconductor wafer W mounted on an upper surface of the mounting table 44.

A plurality of, e.g., three pin insertion holes 48 (only two of the holes are shown in FIG. 1) are formed through the mounting table 44 in a vertical direction. Upthrust pins 50 are inserted into the respective pin insertion holes 48 with a margin to move up and down therethrough. Bottom ends of the upthrust pins 50 are supported by circular ring-shaped upthrust rings 52 made of ceramic, e.g., alumina, without being fixed. An arm part 54 extending from the upthrust rings 52 is connected to a rod 56 passing through the bottom portion 30 of the processing chamber 14, and the rod 56 is lifted up and down by an actuator 58.

Accordingly, when the wafer W is transferred, the upthrust pins 50 can be protruded upward from and retracted into the pin insertion holes 48. An extensible and contractible bellows 60 surrounding the rod 56 is provided between the actuator 58 and the bottom portion 30 of the processing chamber 14, thereby enabling elevation of the rod 56 while maintaining airtightness of the processing chamber 14.

A diameter of the opening 34 at an inlet side of the gas exhaust space 32 is smaller than that of the mounting table 44. Thus, the processing gas flowing down along a peripheral portion of the mounting table 44 turns to a bottom side of the mounting table 44 and is introduced into the opening 34. A gas exhaust port 62 communicating with the gas exhaust space 32 is formed at a lower portion of a sidewall of the cylindrical body 36 having the bottom portion 38 and is connected to a vacuum exhaust system 64. The vacuum exhaust system 64 has an exhaust path 66 connected to the vacuum exhaust port 62. The exhaust path 66 is provided with a pressure control valve 68, a vacuum pump 70, a waste gas scrubber (not shown) and the like. Thus, an inner space of the processing chamber 14 and the gas exhaust space 32 can be exhausted to vacuum while controlling the pressure thereof.

The shower head 16 is connected to a source gas supply unit 72 for supplying a source gas and an oxygen-containing gas supply unit 74 for supplying an oxygen-containing gas, e.g., water vapor ($H_2O$). Specifically, the source gas supply unit 72 has a source gas line 78 connected to a gas inlet 76 of one of the gas diffusion spaces 22A. The source gas line 78 is connected to a first material supply source 86 containing a first material through a switching valve 82 and a flow rate controller, e.g., a mass flow controller, 84 that are provided in the source gas line 78.

A transition metal-containing material is used as the first material. The transition metal-containing material is evaporated by bubbling using a nonreactive gas such as Ar gas with its flow rate controlled. This transition metal-containing gas is supplied together with the nonreactive gas. If a vapor pressure of the material is low, the first material supply source 86 is heated by a heater (not shown) to increase the vapor pressure of the material. For example, $(MeCp)_2Mn$ (precursor) may be used as the transition metal-containing material.

As the nonreactive gas for bubbling the material, rare gas such as He and Ne, or $N_2$ may be used instead of the Ar gas. The source gas line 78, and the switching valve 82 and the mass flow controller 84 which are provided in the source gas line 78 are entirely wound by a tape heater 96 to heat them, thereby preventing re-liquefaction of the source gas. Further, a plurality of source gas supply units may be provided according to kinds of the material.

The oxygen-containing gas supply unit 74 has a gas line 100 connected to a gas inlet 98 of the other gas diffusion space 22B. The gas line 100 is connected to a water vapor source 106 for generating water vapor through a switching valve 102 and a flow rate controller, e.g., a mass flow controller, 104 that are provided in the gas line 100. The water vapor source 106 is formed of, e.g., a reservoir tank. The reservoir tank is maintained at a temperature of, e.g., 40° C., by a temperature controller 103 and generates water vapor through evaporation. The gas line 100, and the switching valve 102 and the mass flow controller 104 which are installed in the gas line 100 are entirely wound by a tape heater 105 to heat them, thereby preventing re-liquefaction of the water vapor.

Since the shower head 16 is closely adjacent to the mounting table 44, a temperature of the gas injection surface 18 tends to rise. This may cause gas decomposition when the source gas is introduced into the gas diffusion space 22B located at a lower portion. Accordingly, the source gas is introduced into the gas diffusion space 22A located at an upper portion of the shower head 16 while the oxygen-containing gas (water vapor) is introduced into the gas diffusion space 22B located at a lower portion of the shower head 16.

Although not illustrated in the drawings, in order to provide a purge gas as required, a nonreactive gas supply unit for purging is connected to the shower head 16. A nonreactive gas such as $N_2$ gas, Ar gas, He gas, and Ne gas may be used as a purge gas. The gas line 100 for flowing the water vapor therethrough is connected with another gas line 120 for flowing a reductive gas therethrough, and optionally supplies the reductive gas, e.g., $H_2$ gas with its flow rate controlled by a switching valve 122 arranged in the gas line 120.

In order to control an overall operation of the film forming apparatus includes a controller 108 equipped with, e.g., a computer. The controller 108 carries out starting/stopping of gas supply, control of a flow rate thereof, control of an internal pressure of the processing chamber 14, temperature control of the wafer W, and the like. The controller 108 also has a storage medium 110 to store a computer program for implementing the above-mentioned control operations. The storage medium 110 may include, e.g., a flexible disk, a flash memory, a hard disk, a compact disk (CD), and the like.

Second Embodiment

Figure 2:
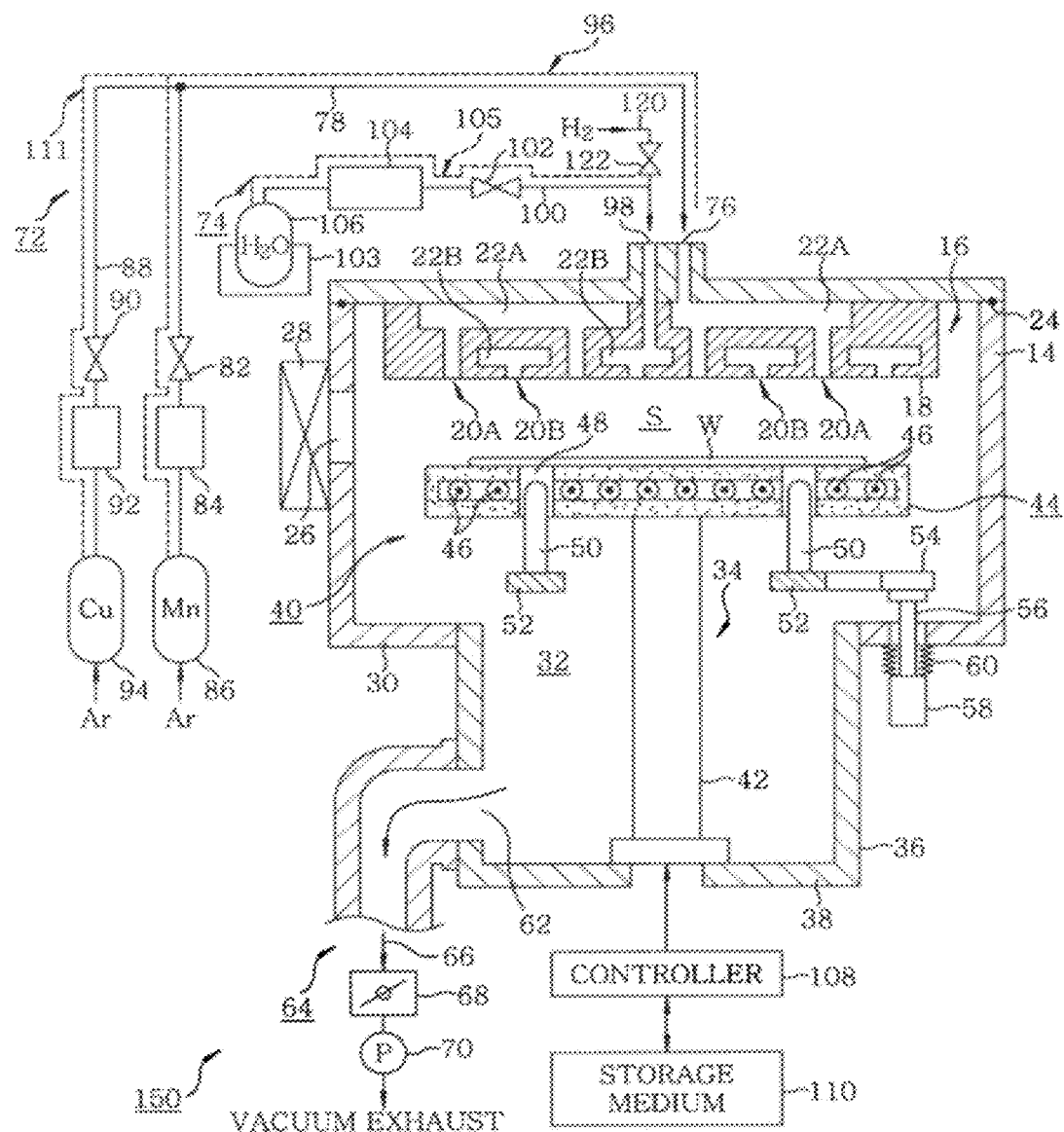
FIG. 2 illustrates a configuration of a film forming apparatus in accordance with a second embodiment of the present invention.

Hereinafter, a film forming apparatus in accordance with a second embodiment of the present invention will be described in detail. FIG. 2 illustrates a configuration of the film forming apparatus in accordance with the second embodiment of the present invention. The film forming apparatus 150 is used to form a CuMn-containing alloy film including a transition metal. However, if a Cu-containing source gas is not used, the above apparatus may also form a Mn-containing film. In FIG. 2, the constitutional components substantially the same as those of FIG. 1 are represented by the same reference numerals and a description thereof will be omitted.

The film forming apparatus 150 of the second embodiment further includes a branch line 88 diverged from the source gas line 78 through which a transition metal-containing source gas flows. The branch line 88 is connected to a second material supply source 94 containing a second material through a switching valve 90 and a flow rate controller 92, e.g., a mass flow controller, arranged in the branch line 88. The second material used herein may be a Cu-containing material. The Cu-containing material is bubbled and evaporated by a nonreactive gas, e.g., Ar gas with its flow rate controlled, and is supplied together with the nonreactive gas. When a vapor pressure of the material is low, the second material supply source 94 is heated by a heater (not shown) in order to increase the vapor pressure. The Cu-containing material may include Cu-containing precursors such as Cu(hfac)TMVS, $Cu(hfac)_2$, $Cu(dibm)_2$, and the like. In addition to the bubbling manner, vaporization of a liquid material and/or vaporization of a solution material may also be employed to supply a source gas. The vaporization of a liquid material is a method of vaporizing a liquid material at room temperature by using a vaporizer, and the vaporization of a solution material means a method wherein a solid or liquid material is dissolved in a solvent at room temperature and the resultant solution is vaporized by using a vaporizer. These methods are also suitably employed to supply a Mn-containing source gas, without restriction to the Cu-containing source gas.

The branch line 88, the switching valve 90 and the flow rate controller 92 are entirely wound by a tape heater 111 to heat them, thereby preventing re-liquefaction of the source gas. In the second embodiment, the Mn-containing source gas and the Cu-containing source gas are already mixed together before reaching the shower head 16, and then introduced into the shower head 16. The Cu-containing source gas and the Mn-containing source gas may also be provided in the shower head 16 through two independent gas lines, so as to prevent the gases from being mixed before reaching the shower head.

Next, the operation of the film forming apparatus configured as described above will be described in detail. The following description will be given to generally explain both the film forming apparatuses 12 and 150 depicted in FIG. 1 and FIG. 2, respectively. First, an untreated semiconductor wafer W is held on a transfer arm (not shown) and is loaded into the processing chamber 14 through an open gate valve 28 and a loading/unloading port 26. The wafer W is delivered on the raised upthrust pins 50 from the transfer arm, and then mounted on the upper surface of the mounting table 44 by lifting down the upthrust pins 50.

Then, the source gas supply unit 72 and the oxygen-containing gas supply unit 74 are operated to supply the respective processing gases into the shower head 16 while the flow rates thereof are controlled. Therefore, the processing gas is introduced into the processing space S via the gas injection holes 20A and 20B. Supply of each processing gas will be described in detail later. In the first embodiment illustrated in FIG. 1, the Mn-containing source gas and water vapor are supplied. On the other hand, the Mn-containing source gas, the Cu-containing source gas and water vapor are supplied in the second embodiment illustrated in FIG. 2.

The processing chamber 14 and the gas exhaust space 32 are vacuumized by continuously operating the vacuum pump 70 of the vacuum exhaust system 64. The processing space S is maintained at a desired process pressure by adjusting a valve opening degree of the pressure control valve. Here, the wafer W is maintained at a desired process temperature by heating the wafer W by using a resistance heater 46 provided in the mounting table 44. As a result, a desired thin film is formed on the surface of the semiconductor wafer W.

In this regard, the film forming apparatus of the first embodiment shown in FIG. 1 forms a Mn-containing film while the film forming apparatus of the second embodiment shown in FIG. 2 forms a CuMn-containing alloy film or a Mn-containing film. The CuMn-containing alloy film may be any one selected from CuMn, (Cu+MnO$_x$) and CuMn$_x$O$_y$ or a combination thereof.

First and Second Embodiments for Methods of the Invention

Figure 3A:
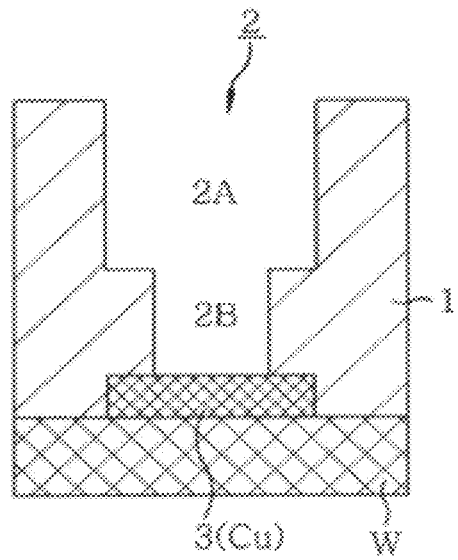
FIGS. 3A to 3D illustrate thin film deposition in a recess of a semiconductor wafer during individual processes.
Figure 4A:
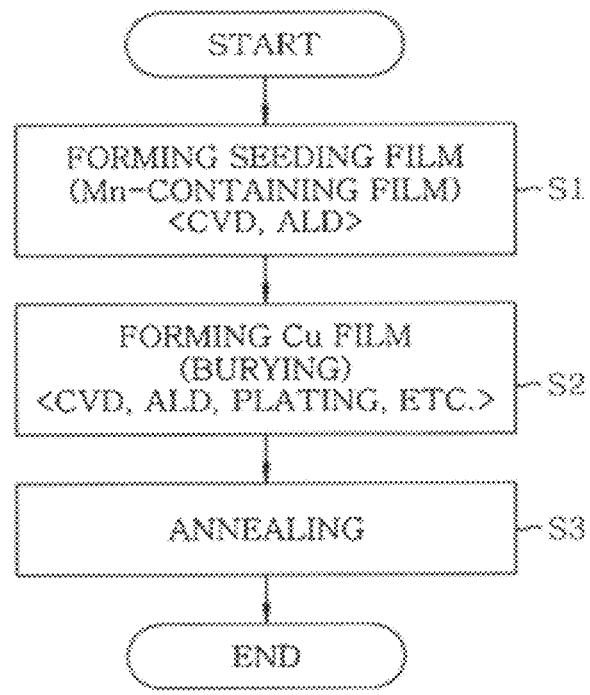
FIGS. 4A and 4B are flow charts illustrating film forming methods in accordance with the first and second embodiments of the present invention.
Figure 4B:
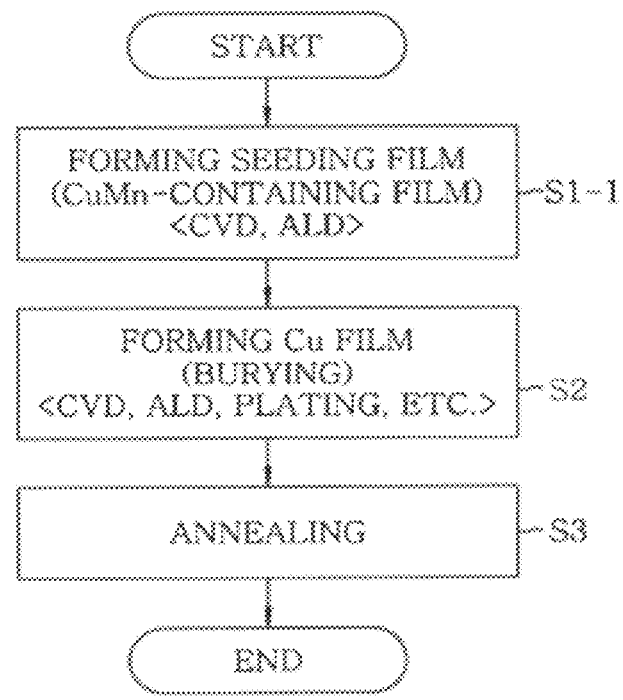
Figure 5A:
FIGS. 5A and 5B are timing graphs illustrating gas supply states by CVD and ALD, respectively, to form a seeding film of a Mn-containing film.
Figure 5B:
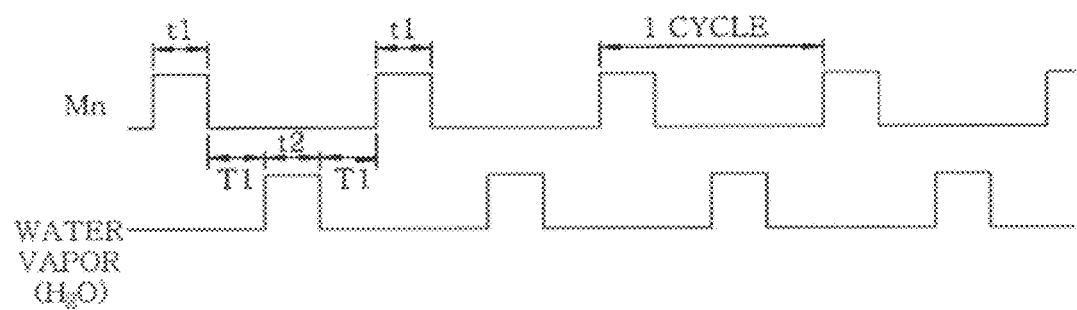
Figure 6A:
FIGS. 6A to 6C are timing graphs illustrating gas supply states by CVD and ALD, respectively, to form a seeding film of a CuMn-containing alloy film.
Figure 6B:
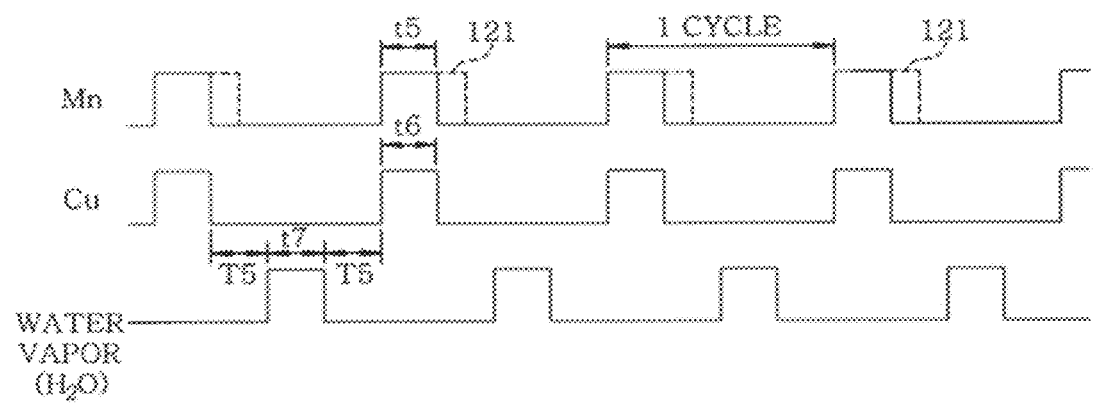
Figure 6C:
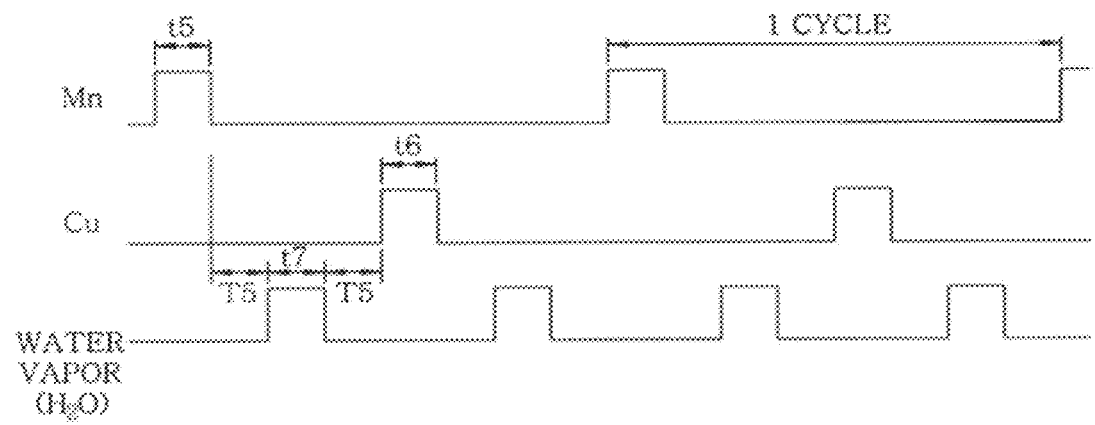

Hereinafter, a film forming method in accordance with the embodiments of the present invention will be described in detail with reference to FIGS. 3A to 6C. FIGS. 3A to 3D illustrate thin film deposition in a recess of a semiconductor wafer during individual processes. FIGS. 4A and 4B are flowcharts showing some of the processes of the film forming method in accordance with the first and second embodiments of the present invention. FIG. 4A depicts a film forming method for forming a Mn-containing film in accordance with the first embodiment of the present invention, and FIG. 4B depicts a film forming method for forming a CuMn-containing film in accordance with the second embodiment of the present invention. FIGS. 5A and 5B are timing graphs illustrating gas supplying states by CVD and ALD, respectively, in formation of a seeding film of a Mn-containing film. FIGS. 6A to 6C are timing graphs illustrating gas supply states by CVD and ALD, respectively, in formation of a seeding film of a CuMn-containing alloy film.

An object of the method of the present invention is to continuously conduct film forming and annealing processes in a single film forming apparatus (in-situ). For instance, when a wafer W is loaded into the film forming apparatus 12, a recess 2 such as a trench or a hole is formed on a surface of an insulating layer 1, e.g., an interlayer insulating film formed on the wafer W, as shown in FIG. 3A. Further, a lower wiring layer 3 made of, e.g., copper is exposed on the bottom of the recess 2.

Specifically, the recess 2 includes a narrow and long groove (trench) 2A in a concave shape and a hole 2B formed at a part of the bottom of the groove 2A wherein the hole 2B is a contact hole or a through hole. The wiring layer 3 is exposed on the bottom of the hole 2B and is electrically connected to a lower wiring layer or another device such as a transistor. The lower wiring layer and the device such as a transistor are not illustrated in the drawings. The insulating layer 1 serving as an underlayer includes silicon-based oxides, nitrides or the like and, e.g., SiO$_2$.

Figure 3B:
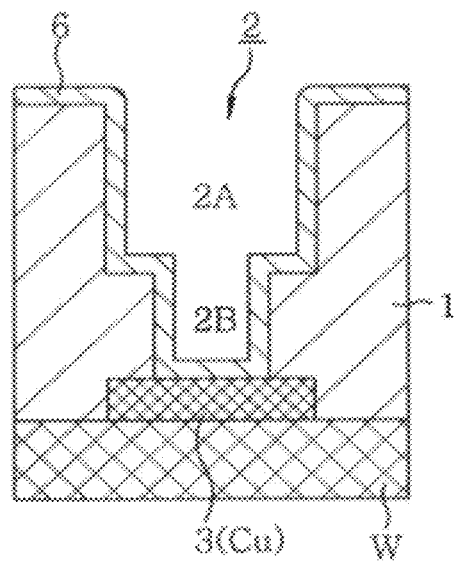

Further, in the method of the present invention, a seeding film 6 is prepared by a seeding film formation process as illustrated in FIG. 3B. Here, the seeding film 6 may be a Mn-containing film (step S1 in FIG. 4A) or a CuMn-containing alloy film (step S1-1 in FIG. 4B). The seeding film 6 may be obtained by CVD or ALD. The ALD means a film forming method of repeatedly forming individual thin films at an atomic or molecular level by alternately supplying different processing gases.

Figure 3C:
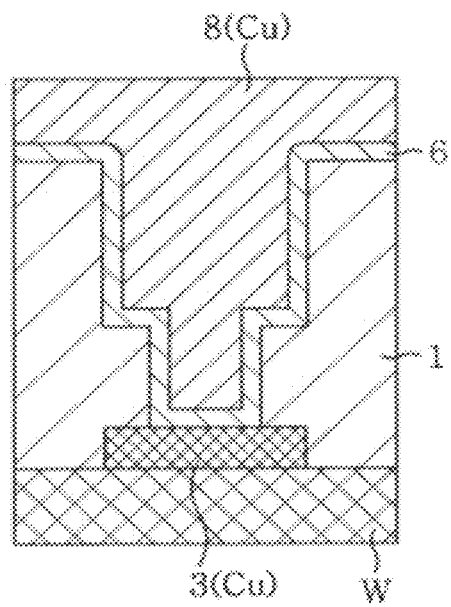
Figure 3D:
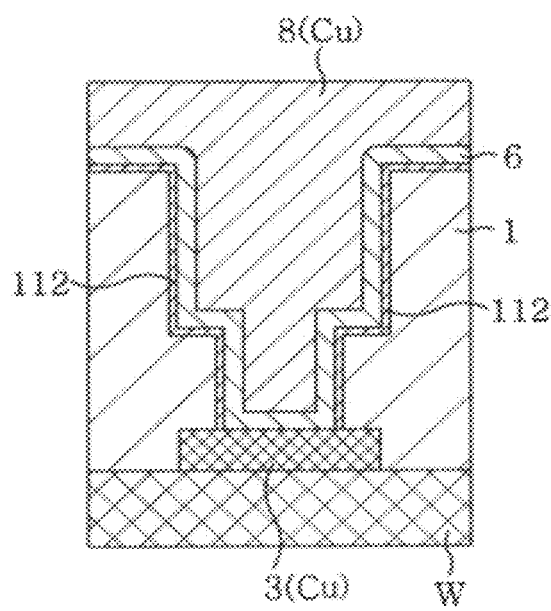

Next, as illustrated in FIG. 3C, a Cu film 8 serving as a metal film is formed during a burying process. The Cu film 8 is buried in the recess 2 (step S2 in FIG. 4A and step S2 in FIG. 4B). The burying process may be performed by CVD, ALD, or conventionally known PVD (sputtering or vapor-deposition) or plating method. If required, the wafer W is exposed to a high temperature under an oxygen-containing gas atmosphere adjusted to a certain concentration in order to conduct annealing thereof, the seeding film 6 and the insulating layer 1 formed of SiO$_2$ film serving as an underlayer are subjected to self-alignment reaction, as illustrated in FIG. 3D, so as to produce a barrier layer 112 formed of MnSi$_x$O$_y$ film (x, y: random positive) or MnO$_x$ film (x: random positive) (step S3 in FIG. 4A and step S3 in FIG. 4B). The annealing process may be omitted when the barrier layer 112 is sufficiently formed in any of previous processes performed at a high temperature (e.g., a seeding film formation process, a Cu film formation process, etc.). However, the annealing process is preferably performed in order to obtain a complete barrier layer 112.

In this regard, the following description will be given of individual processes of the method of the present invention. Two different methods are proposed for formation of a Mn-containing film (step S1 in FIG. 4A) serving as a seeding film 6 (by using the film forming apparatus illustrated in FIG. 1). A first method includes simultaneously supplying a Mn-containing source gas and water vapor and forming a Mn-containing film by CVD, as shown in FIG. 5A. In case of using the CVD, timings of starting and stopping the supply of water vapor may shift around (before and after) the timings of starting and/or stopping the supply of Mn-containing source gas.

As for process conditions for the CVD, a process temperature (wafer temperature) ranges from 70 to 450° C. and a process pressure ranges from 1 Pa to 13 kPa. A flow rate of the Mn-containing source gas is not particularly limited, but in consideration of film forming speed, may range from 0.1 to 10 sccm. Further, a flow rate of the water vapor is not particularly limited, but in consideration of film forming speed, may range from 0.05 to 20 sccm.

As for the CVD, if a supply amount of the Mn-containing source gas is set to M1 sccm and a supply amount of the water vapor is set to M2 sccm, a ratio of M1 to M2 (M1/M2) may be $0.001 \leq M1/M2 \leq 50$, preferably $0.01 \leq M1/M2 \leq 5$, and more preferably $0.5 \leq M1/M2 \leq 2$.

The method in accordance with the second embodiment adopts an ALD process as illustrated in FIG. 5B such that the Mn-containing source gas and the water vapor flow in alternative, intermittent and repetitive manners. A break-off period T1 between supply of the Mn-containing source gas and supply of the water vapor is defined as a purge time. A purging process may be conducted by discharging a residual gas in the processing chamber 14 only by vacuum evacuation, or by vacuumizing the processing chamber 14 while introducing a nonreactive gas such as N$_2$ gas into the processing chamber 14. Such a purging process may also be employed in the following process described below.

In the ALD, a period from a certain supply of the Mn-containing source gas to the next supply of the Mn-containing source gas is defined as one deposition cycle and a very thin Mn-containing film (in the range of, e.g., 0.2 to 0.3 nm) is formed during each deposition cycle. Here, a required thickness of the seeding film is about 2 nm and the Mn-containing film may have such a thickness, e.g., by repeating about 10 deposition cycles. Briefly, compared to the CVD process, the ALD process enables formation of a thinner film with better control of film thickness.

Process conditions of the ALD are substantially the same as those of the CVD and, more particularly, a process temperature ranges from 70 to 450° C. and a process pressure ranges from 1 Pa to 13 kPa. A flow rate of the Mn-containing source gas ranges from about 0.1 to 10 sccm, and a flow rate of the water vapor ranges from about 0.05 to 20 sccm.

A supply time t1 of the Mn-containing source gas ranges from about 10 to 15 sec, while a supply time t2 of the water vapor is about 10 sec. Moreover, the break-off period T1 ranges from about 20 to 120 sec. As for film formation using the ALD, the film is more sufficiently adhered to an inner wall of a fine recess, compared to film formation using the CVD, thereby remarkably enhancing step coverage. The smaller a dimension of the recess is, the more effective the ALD is.

There are three methods to form a CuMn-containing alloy film as a seeding film (step S1-1 in FIG. 4B) (by using a film forming apparatus illustrated in FIG. 2). A first film forming method includes, as shown in FIG. 6A, simultaneously flowing a Cu-containing source gas, a Mn-containing source gas and water vapor, and forming the CuMn-containing alloy film by CVD.

A second film forming method is carried out by ALD as shown in FIG. 6B and includes flowing both source gases, e.g., a Cu-containing source gas and a Mn-containing source gas, and water vapor in alternative, intermittent and repetitive manners. A break-off period T5 between supply of the Cu-containing source gas/Mn-containing source gas and supply of the water vapor is a purge time. A purging process may be conducted by discharging a residual gas in the processing chamber 14 only through vacuum evacuation, or by vacuumizing the processing chamber 14 while introducing a non-reactive gas such as $N_2$ gas into the processing chamber 14. Such a purging process may also be employed in the following process described below.

In the ALD, a period from a certain supply of the Cu-containing source gas/Mn-containing source gas to the next supply of the Cu-containing source gas/Mn-containing source gas is defined as one deposition cycle, and a very thin CuMn-containing alloy film (in the range of, e.g., 0.4 to 0.6 nm) is formed during each deposition cycle. Here, a required thickness of a seeding film 6 ranges from about 0.5 to 2 nm that is a thickness of pure Mn metal (eliminating Cu) in the CuMn-containing alloy film, and the CuMn-containing alloy film may have such a thickness, e.g., by repeating about 10 to 100 deposition cycles. Briefly, compared to the CVD, the ALD enables formation of a thinner film with better control of film thickness.

As for process conditions of the ALD (including the CVD), a process temperature ranges from about 70 to 450° C. and a process pressure ranges from about 1 Pa to 13 kPa. A flow rate of the Mn-containing source gas ranges from about 0.1 to 10 sccm, while a flow rate of the Cu-containing source gas ranges from about 1 to 100 sccm. Further, a flow rate of the water vapor ranges from about 0.05 to 20 sccm. As for formation of the CuMn-containing alloy film, a flow rate of Cu is preferably 10 times a flow rate of Mn to form a Cu-rich CuMn-containing alloy film. However, since Cu has weak adhesion to an insulating film such as $SiO_2$, a Mn-rich CuMn-containing alloy film may be formed by increasing a ratio of a flow rate of the Mn-containing source gas to a flow rate of the Cu-containing source gas during initial deposition cycles.

A supply time t5 of the Mn-containing source gas ranges from about 10 to 15 sec, a supply time t6 of the Cu-containing source gas ranges from about 10 to 50 sec, and a supply time t7 of the water vapor is about 10 sec. Further, the break-off period T5 ranges from about 20 to 120 sec. In this case, as described above, since Cu has weak adhesion to an insulating film such as $SiO_2$, the supply time t5 of the Mn-containing source gas may be, e.g., 15 sec which is longer than the supply time t6 of the Cu-containing source gas during initial deposition cycles (see dotted lines 121 in FIG. 6B). That is, a process recipe may be set such that the proportion of the Mn-containing source gas to the Cu-containing source gas supplied in the chamber sequentially varies according to film deposition time or deposition film thickness. Accordingly, ingredients in the CuMn-containing alloy film may be gradually modified from a Mn-rich state to a Cu-rich state. Thus, it is possible to improve adhesion between the insulating layer 1 and the seeding film 6 and/or between the Cu film 8 and the seeding film 6 and prevent a film from being peeled off during film formation.

As shown in FIG. 6C, a third film forming method includes supplying both the above gases in alternative, intermittent and repetitive manners and flowing the water vapor during an intermittent period. More particularly, one deposition cycle includes supply of a Mn-containing source gas, interruption of the Mn-containing source gas supply, supply of water vapor, interruption of the water vapor supply, supply of a Cu-containing source gas, interruption of the Cu-containing source gas supply, supply of the water vapor, and interruption of the water vapor supply. Such a deposition cycle is defined as an ALD cycle and is repeatedly executed. In this case, one deposition cycle time is twice the deposition cycle time in the case shown in FIG. 6B. The above film forming method produces a seeding film 6 in which very thin Mn-containing films having a film thickness of 0.2 to 0.3 nm and very thin Cu-containing films having a film thickness of 0.2 to 0.3 nm are alternately laminated. Since both the films are very thin, Mn and Cu are diffused into each other to form an alloy. Moreover, in consideration of adhesiveness and barrier properties (that is, Cu diffusion into the insulating layer 1), an initially supplied source gas is preferably the Mn-containing source gas.

As for film formation using the ALD, the film is more sufficiently adhered to an inner wall of a fine recess, compared to film formation using the CVD, thereby remarkably enhancing step coverage. The smaller a dimension of the recess is, the more effective the ALD is.

As described above, the seeding film forming step S1 shown in FIG. 4A or the seeding film forming step S1-1 shown in FIG. 4B is completed.

Next, the following description will be given of formation of a Cu film serving as a metal film 8 shown in step S2 of FIGS. 4A and 4B (see FIG. 3C). When the seeding film 6 is formed by using the film forming apparatus illustrated in FIG. 1, which has no Cu-containing source gas supplier, a wafer is delivered and loaded in the film forming apparatus shown in FIG. 2. When the seeding film 6 is formed by using the film forming apparatus illustrated in FIG. 2, the same apparatus is used. The Cu-containing source gas and $H_2$ gas serving as a reductive gas are simultaneously supplied into the processing chamber 14, and the metal film 8 formed of a Cu film is formed by CVD. Alternatively, the Cu-containing source gas and $H_2$ gas may be alternately and repeatedly supplied, as illustrated in FIGS. 6B and 6C, to thereby form the metal film 8 of a Cu film. Moreover, the metal film 8 of a Cu film may be formed by simple pyrolysis reaction by supplying only the Cu-containing source gas without the supply of $H_2$ gas.

As for conditions of the above-mentioned process (including the CVD), a process temperature ranges from about 70 to 450° C. and a process pressure ranges from about 1 Pa to 13 kPa. A flow rate of the Cu-containing source gas ranges from about 1 to 100 sccm while a flow rate of the $H_2$ gas ranges from about 5 to 500 sccm. Instead of the CVD or ALD, a conventional PVD (sputtering or vapor-deposition) or a plating method may be used to form the metal film 8 of a Cu film to be buried in the recess 2.

Compared to the plating method, the CVD or ALD enables relatively easy deposition of a thin film on an inner wall of a fine recess. Accordingly, even if the recess becomes finer, a film can be efficiently buried in the recess without voids. Thereafter, in an annealing process shown in step S3 of FIGS. 4A and 4B (see FIG. 3D), the wafer W on which the burying process has been completed is heated at a desired process temperature, e.g., about 100 to 450° C. under an oxygen-containing gas atmosphere with a certain oxygen level. As a result, a self-aligned barrier layer 112 formed of a $MnSi_xO_y$ film is reliably formed at a boundary between the seeding film 6 and the insulating layer 1 of an $SiO_2$ film serving as an underlayer. When oxygen (an oxygen supply unit is not shown) or the like is supplied to the processing chamber during annealing as described above, an additional device capable of controlling an oxygen partial pressure to, e.g., about 10 ppb may be employed.

The annealing is conducted to reliably form the barrier layer 112. When the previous process such as the seeding film formation or the Cu film formation has been executed under an oxygen-containing atmosphere and self-formation of the barrier layer was carried out at a high process temperature of, e.g., 100 to 150° C., the barrier layer 112 is already formed with sufficient thickness to thereby omit the annealing process. For the plating process shown in step S2 of FIGS. 4A and 4B, the annealing process is of course required. Further, if the film forming apparatus 150 shown in FIG. 2 is used, the seeding film formation, the Cu film formation using the CVD or ALD, and the annealing process may be continuously performed by the same film forming apparatus 150.

As is apparent from the above preferred embodiments, a thin film is formed on a surface of a wafer W by heat treatment using a transition metal, especially, Mn-containing source gas and an oxygen-containing gas (water vapor) in the vacuum-evacuable film forming apparatus illustrated in FIG. 2. Consequently, a high film formation rate may be ensured while reducing an incubation time, and the seeding film 6 may be formed in the fine recess 2 with high step coverage. Moreover, continuous processing in the same processing chamber 12 is possible, thereby considerably reducing overall installation costs.

In addition, it is not necessary to separately form a barrier layer and a seeding film (corresponding to a Ta/TaN barrier layer and a Cu seeding film in the prior art), thereby enhancing throughput thereof.

In case of using a CuMn-containing alloy film as the seeding film 6 (FIG. 4B), adhesiveness between the seeding film 6 and the metal film 8 may be increased since the seeding film 6 contains Cu serving as an ingredient of the metal film 8.

<Evaluation of Mn-Containing Film>

Figure 7A:
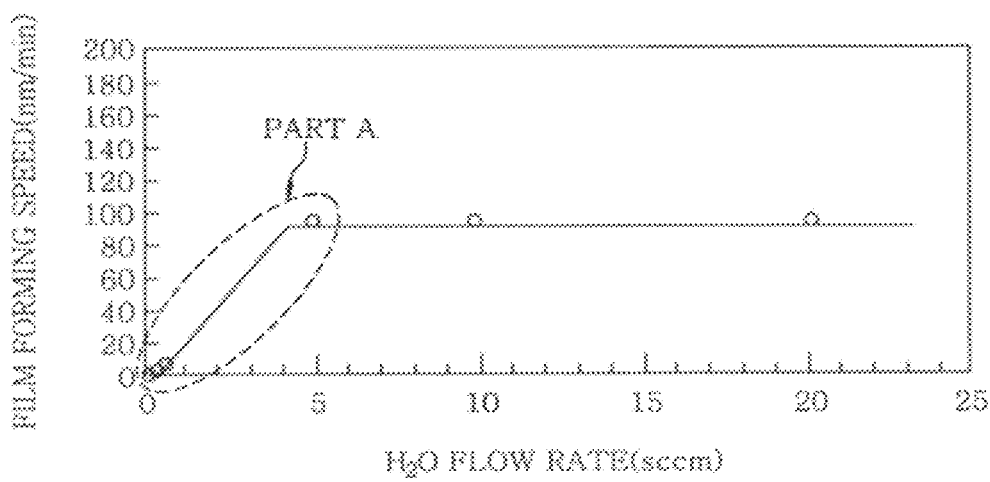
FIGS. 7A and 7B are graphs illustrating dependence of a film forming speed of the Mn-containing film upon $H_2O$ flow rate.
Figure 7B:
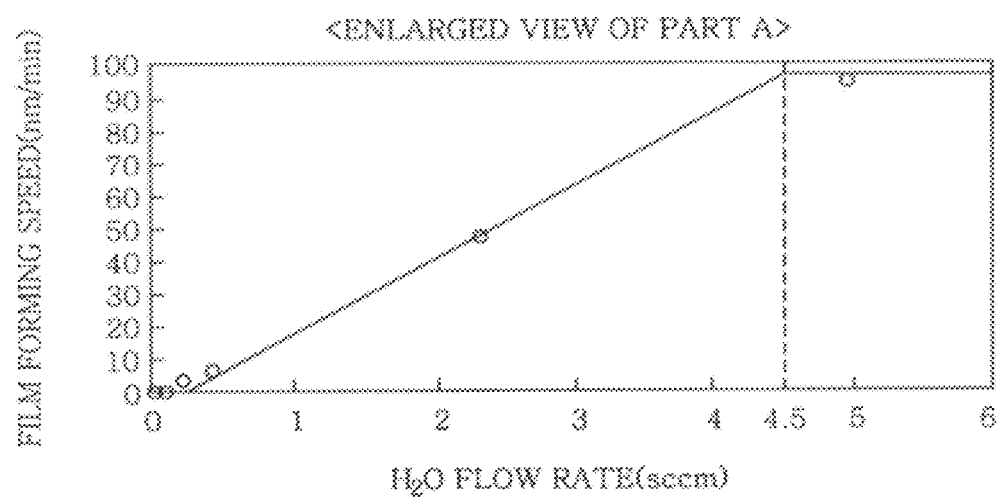

By using the film forming apparatus shown in FIG. 1 and the film forming method illustrated in step S1 of FIG. 4A, an experiment was carried out to form a Mn-containing film. Results of examining the prepared Mn-containing film are described with reference to FIGS. 7A to 8B. The Mn-containing film was formed by CVD shown in FIG. 5A. FIGS. 7A and 7B are graphs illustrating dependence of a film forming speed of the Mn-containing film upon a $H_2O$ flow rate. In order to determine the film forming speed, a film thickness was measured by X-ray fluorescence (XRF) analysis. FIGS. 8A and 8B are graphs illustrating X-ray diffraction results to examine influence of $H_2O$ upon formation of the Mn-containing film.

In the graphs of FIGS. 7A and 7B, a $H_2O$ flow rate was plotted on the horizontal axis while a film forming speed was plotted on the vertical axis. The $H_2O$ flow rate was varied in the range of 0 to 20 sccm. FIG. 7B is an enlarged view illustrating part A enclosed by a dotted line in FIG. 7A.

Process conditions for formation of a Mn-containing film are as follows.

Flow rate of Mn-containing material (($EtCp)_2Mn$): 2.2 sccm
    Bubbling Ar gas flow rate: 25 sccm
    Wafer temperature: 100° C.
    Process Pressure: 133 Pa
    $H_2O$ flow rate: 0 to 20 sccm
    Film forming period: 30 min The flow rate (2.2 sccm) of the Mn-containing source gas was obtained by the Ideal Gas Equation from an internal temperature (76.0° C.) of a material bottle, an internal pressure (4.5 torr) of the bottle, a partial pressure (0.37 torr) of the Mn-containing source gas, and the flow rate of the bubbling Ar gas. As shown in FIGS. 7A and 7B, it can be seen that the film forming speed is increased in proportion to increase of the $H_2O$ flow rate in a low $H_2O$ flow rate region. On the other hand, when the $H_2O$ flow rate reaches about 4.5 sccm (hereinafter, referred to as a "saturation point"), the film forming speed becomes about 90 nm/min and does not rise further even if the $H_2O$ flow rate is additionally increased.

From the results, it is understood that a supply amount of the Mn-containing source gas is insufficient in a right area relative to the saturation point shown in the graph of FIGS. 7A and 7B and the film forming speed rises if a supply amount of the Mn-containing source gas increases.

On the contrary, since an $H_2O$ supply amount is insufficient in a left area relative to the saturation point, the film forming speed rises as the $H_2O$ supply amount increases. Accordingly, it can be seen that it is preferable to control the film forming speed by controlling the $H_2O$ supply amount and/or the Mn-containing source gas supply amount.

At the saturation point in the graphs shown in FIGS. 7A and 7B, the Mn-containing source gas supply amount is about 2.2 sccm and the $H_2O$ supply amount is about 4.5 sccm and, therefore, it is expected that a reaction ratio of the Mn-containing source gas to $H_2O$ is 1:2. Accordingly, in consideration of the reaction ratio, M1/M2 is preferably defined by the following expression:

$$0.001 \leq M1/M2 \leq 50,$$

where M1 is a supply amount of Mn-containing source gas and M2 is a supply amount of $H_2O$.

The above ratio is preferably $0.01 \leq M1/M2 \leq 5$ and more preferably $0.5 \leq M1/M2 \leq 2$.

When the ratio is $0.5 \leq M1/M2 \leq 2$, the Mn-containing source gas is always excessively supplied. Thus, if the $H_2O$ supply amount which can be easily controlled with high accuracy is precisely adjusted even though the Mn-containing source gas supply amount which cannot be easily controlled with high accuracy is unstable, the film forming speed may be exactly regulated to a desired level.

When the ratio is $0.5 \leqq M1/M2 \leqq 2$, the film forming speed can be varied with high accuracy by adjusting the $H_2O$ supply amount. Further, if M1/M2 exceeds 2, the larger M1/M2, the more increasing a waste amount of the Mn-containing source gas that does not undergo the reaction, thereby increasing film forming costs.

From the experiment, it was found that a Mn film thickness obtained with $H_2O$ supply of 0 sccm (in this case, the film is formed simply by pyrolysis reaction) is 0.3 nm when a Mn-containing film is prepared during a film forming period of 30 minutes under the process conditions described above. On the other hand, a thickness of the Mn-containing film prepared when the $H_2O$ supply amount is 10 sccm is about 2800 nm, and it means the film forming rate increases by 9300 times.

FIGS. 8A and 8B are graphs illustrating X-ray diffraction results of the Mn-containing film formed under the aforementioned process conditions. In each graph, a horizontal axis shows X-ray diffraction angle while a vertical axis shows X-ray diffraction intensity. FIG. 8A illustrates a case in which a $H_2O$ supply amount is 0 sccm, and FIG. 8B illustrates a case in which a $H_2O$ supply amount is 10 sccm. In FIGS. 8A and 8B, P1 and P2 are peaks of Si single crystals in a substrate (wafer W), and P3 is a peak of MnO (200) crystal plane. In this experiment, the X-ray diffraction intensity was measured immediately after formation of the Mn-containing film (after completion of step S1 in FIG. 4A).

As illustrated in FIG. 8A, only P1 of silicon is present and MnO crystals are hardly formed (0.3 nm) when the $H_2O$ supply amount is zero. On the other hand, as shown in FIG. 8B, when the $H_2O$ supply is provided, there are the silicon peak P2 and a peak P3 with high intensity, and it means formation of numerous MnO crystals. An incubation period (time taken from starting a source gas flow until a film is substantially deposited) is drastically reduced to 1 minute or less from 10 minutes, compared to the case in which the $H_2O$ supply amount is set to 0 sccm. Accordingly, it is understood that $H_2O$ considerably contributes to formation of the Mn-containing film. The obtained MnO film, e.g., a seeding film 6 is connected to a lower Cu wiring layer 3. The MnO film generally has greater resistance than the Cu film serving as a conventional typical seeding film. However, the MnO seeding film is much thinner than a barrier film prepared by sputtering, resulting in a slight increase in contact resistance between the MnO seeding film and Cu wiring layer 3. Also, the MnO film sufficiently functions as a barrier film to prevent Cu diffusion. The seeding film 6 displaced on the bottom of the hole 2B may be removed by punch-through treatment as described later.

In the first and second embodiments of the method of the present invention, it has been described to be more preferable when annealing in step S3 of each flowchart in FIGS. 4A and 4B is executed to sufficiently form the barrier layer 112. However, from results of the experiments, it was found that the barrier layer 112 with a sufficient barrier function can be formed without the annealing under an oxygen atmosphere.

In other words, it is assumed that after implementation of step S1 in FIG. 4A (film formation using a Mn-containing source gas and water vapor) or step S1-1 in FIG. 4B (film formation using a Mn-containing source gas, a Cu-containing source gas and water vapor), a barrier layer $MnO_x$ (x; random positive) or $MnSi_xO_y$ (x, y; random positive) is sufficiently formed only by heating (annealing).

Figure 9:
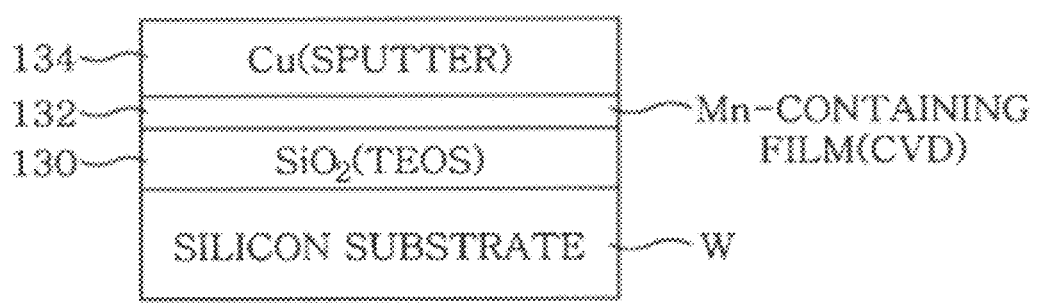
FIG. 9 is a cross sectional view illustrating a stack structure experimentally formed on a silicon substrate.
Figure 10:
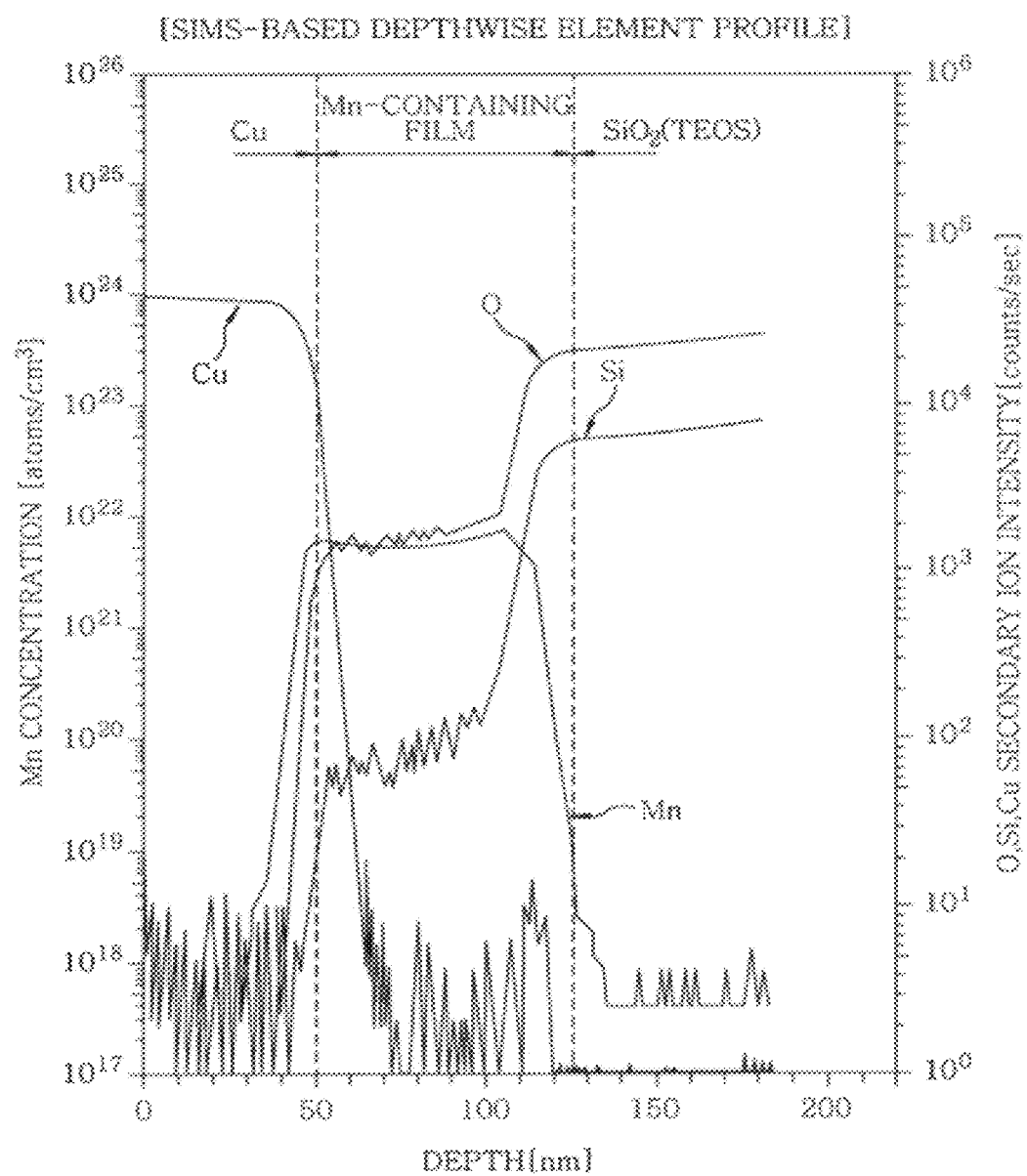
FIG. 10 is a graph illustrating depthwise element profiles of the stack structure experimentally formed.

The following description will be given of results of the experiment supporting the above facts. FIG. 9 is a cross sectional view illustrating a stack structure experimentally formed on a silicon substrate. FIG. 10 is a graph illustrating depthwise element profiles of the stack structure experimentally formed as described above.

Referring to FIG. 9, the experiment was carried out such that an $SiO_2$ film 130 serving as an insulating film was prepared on a silicon substrate W by using tetraethyl orthosilicate (TEOS), and a Mn-containing film 132 serving as a seeding film was formed on the insulating film by CVD using a film forming process in step S1 of FIG. 4A (film formation using Mn-containing source gas and water vapor), and a Cu film 134 was formed by sputtering.

Process conditions for formation of a Mn-containing film are as follows.

Mn-containing material: $(EtCp)_2Mn$
Bubbling gas: Ar, 25 sccm
Substrate temperature: 100° C.
Process Pressure: 133 Pa
$H_2O$ flow rate: 0.2 sccm
Material bottle temperature: 70° C.
Film forming period: 15 min In order to investigate whether the Mn-containing film 132 exhibits a barrier function, a heating acceleration test was executed, and each element profile was measured by SIMS (secondary ion mass analysis). Upon analysing the film from a surface side thereof (at a Cu film side in FIG. 9), Cu atoms in a top layer are implanted into the Mn-containing film. Therefore, the analysis is started from a rear side of the silicon substrate for determination of the element profile. Conditions for such a heating acceleration test were as follows and the test was performed under an Ar atmosphere excluding oxygen.

Supply gas: Ar, 50 sccm
Substrate temperature: 400° C.
Pressure: 665 Pa
Heating time: 40 min In FIG. 10 showing results of the measurement, a horizontal axis represents depth (thickness), while Mn concentration is plotted on a left vertical axis and each secondary ion intensity of O, Si and Cu is plotted on a right vertical axis. Here, a Cu region ranges from about 0 to 50 nm in depth. Further, a $MnO_x$ region ranges from about 50 to 125 nm in depth and an $SiO_2$ region is more than about 125 nm in depth.

As clearly shown in FIG. 10, although Cu atoms were present somewhat and diffused into the Mn-containing film, the Cu atoms did not diffuse into the $SiO_2$ region and were not substantially present therein.

From results of the heating acceleration test for diffusion of Cu atoms performed at 400° C. as described above, it was found that Cu atoms did not diffuse into the $SiO_2$ region. The test results also demonstrated that the Mn-containing film serving as a barrier layer sufficiently exhibits a barrier function even without annealing under an oxygen atmosphere.

<Punch-Through Treatment>

Meanwhile, when the Mn-containing seeding film 6 was obtained in each embodiment of the method of the present invention, the seeding film 6 was present throughout an inner surface of the recess 2 as well as a top surface of the wafer W (a top surface of the insulating layer 1, see FIGS. 3A to 3D). Since the seeding film 6 has electrical insulation property, the seeding film 6 deposited on the bottom of the hole 23 (connected with the lower wiring layer 3) is preferably removed in order to reduce contact resistance therebetween.

Figure 11A:
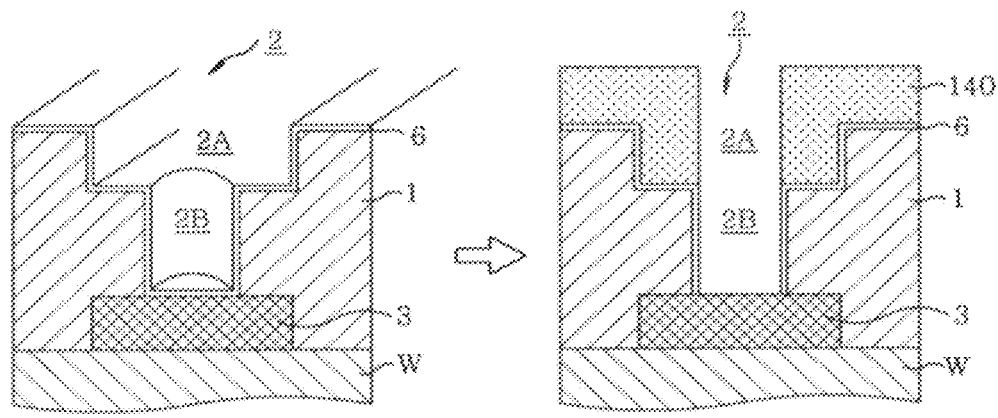
FIGS. 11A and 11B are cross sectional views illustrating punch-through treatment.

Therefore, the seeding film 6 (thin film) deposited on the bottom of the hole 2B is preferably removed by punch-through treatment before formation of a Cu film for burying the Cu film in the recess (each step S2 in FIGS. 4A and 4B). FIG. 11A is a cross sectional view illustrating a first embodiment of the punch-through treatment, and FIG. 11B is a cross sectional view illustrating a second embodiment of the punch-through treatment.

Figure 11B:
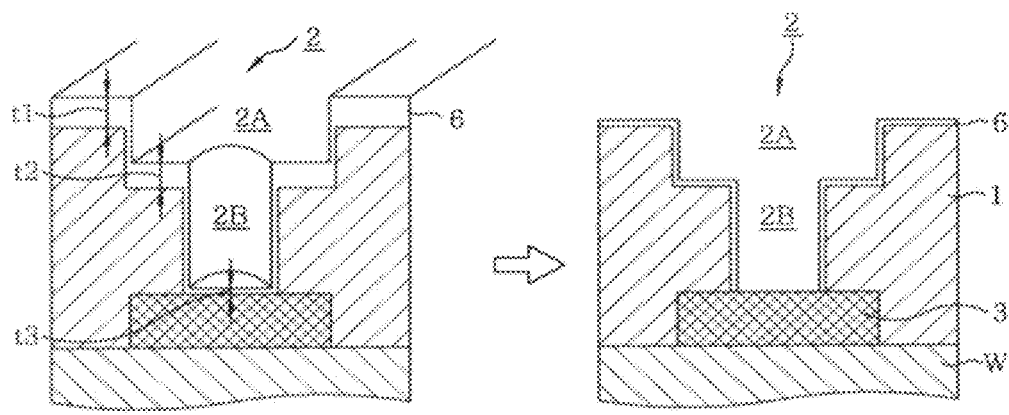
Figure 12A:
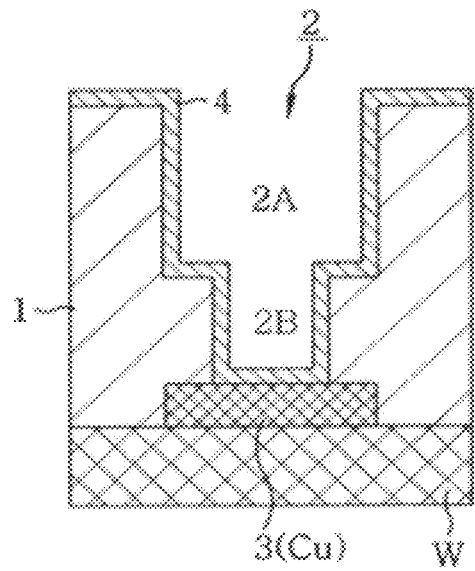
FIGS. 12A to 12C illustrate a conventional burying process in a recess of a semiconductor wafer.
Figure 12B:
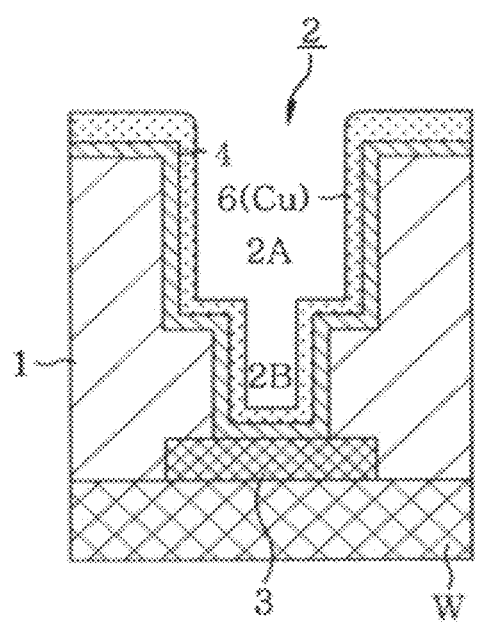
Figure 12C:
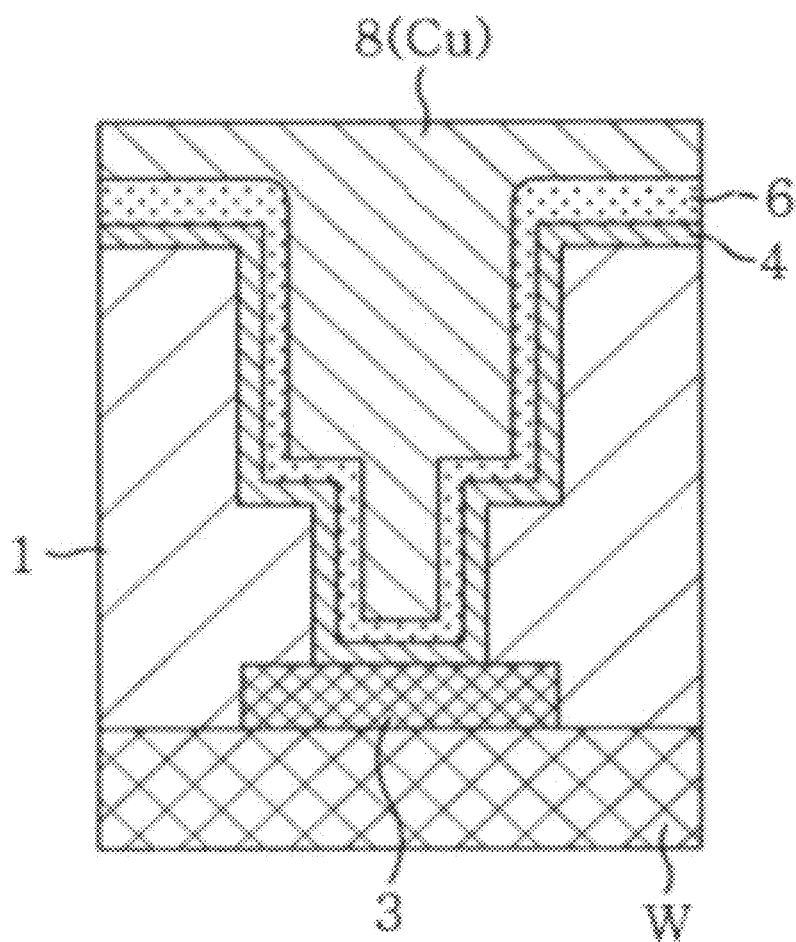

A structure of the semiconductor wafer W in FIGS. 11A and 11B is substantially the same as the structure illustrated in FIGS. 3A to 3D. That is, a recess 2 including a hole 2B and a groove 2A is formed on an insulating layer 1 and a wiring layer 3 is exposed on the bottom of the hole 2B. Referring to FIG. 11A, after the seeding film 6 of a Mn-containing film or a CuMn-containing film is obtained during step S1 or step S1-1 in FIGS. 4A and 4B, a resist 140 thoroughly covers the semiconductor wafer W excluding the hole 2B (see a right side of FIG. 11A). This treatment is performed by coating the resist 140 on the entire surface of the wafer and, then, exposing and developing the coated wafer (a photolithography process). Next, an etching process is conducted by using the resist 140 as a mask, to selectively remove only the thin seeding film 6 deposited on the bottom of the hole 2B. Such an etching process may employ Ar sputtering etching, reactive ion etching (RIE) or the like.

Thereafter, purification of the film was performed after removal of the resist 140. Then, Cu is buried in the recess 2 during formation of the Cu film (step S2 in FIGS. 4A and 4B). Before formation of the Cu film, a Cu seeding film may be prepared and used as a second seeding film.

Referring to FIG. 11B, when a seeding film of a Mn-containing film or a CuMn-containing film is obtained during step S1 or step S1-1 in FIGS. 4A and 4B, the seeding film 6 has a thickness sufficient to supplement an amount cut down from the film during etching in a post-process. In this case, since introduction of a film forming gas into the hole 2B with a micro diameter is difficult, a film thickness t3 at the bottom of the hole 2B becomes relatively thin, compared to a film thickness t1 at the top of the insulating layer 1 and a film thickness t2 at the bottom of the groove 2A, resulting in a relationship of t3<t2≦t1. As a film forming gas such as a Mn-containing source gas and water vapor flows in large amounts to raise a film forming speed, the above tendency (t3<t2≦t1) is more clearly exhibited.

After forming the seeding film, an etching process is performed to etch back the entire surface of the seeding film of a CuMn-containing film, which includes the bottom of the hole 2B. During the etch-back process, t3 becomes zero at first. That is, only the seeding film 6 deposited on the bottom of the hole 2B can be selectively removed. Such an etching process may employ Ar sputtering etching, RIE, or the like.

Thereafter, Cu is buried in the recess 2 during formation of the Cu film (step S2 in FIGS. 4A and 4B). Before formation of the Cu film, a Cu seeding film may be prepared and used as a second seeding film.

Although the film formation was performed by using the thermal CVD and thermal ALD in the above embodiments, the film formation may be performed by plasma CVD, plasma ALD, photo CVD and/or photo ALD using UV or laser light, and the like without being limited thereto. Moreover, although water vapor was used for formation of a Mn-containing film in the above embodiments, $H_2$ gas may also be used as a reductive gas or a carrier gas, in addition to the water vapor.

Although the water vapor was used as an oxygen-containing gas for formation of a metal-containing film in the above embodiments, the oxygen-containing gas is not particularly restricted thereto and may include one or more materials containing at least one selected from the group consisting of $H_2O$ (water vapor), $N_2O$, $NO_2$, $NO$, $O_3$, $O_2$, $H_2O_2$, $CO$, $CO_2$ and alcohol. Such alcohol may include methyl alcohol, ethyl alcohol, and the like.

An organic metal material using the Mn-containing material may be at least one selected from the group consisting of $Cp_2Mn[=Mn(C_5H_5)_2]$, $(MeCp)_2Mn[=Mn(CH_3C_5H_4)_2]$, $(EtCP)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2$, $Mn(acac)_3[=Mn(C_5H_7O_2)_3]$, $Mn(hfac)_2[=Mn(C_5HF_6O_2)_3]$, and $((CH_3)_5Cp)_2Mn[=Mn((CH_3)_5C_5H_4)_2]$. Instead of the organic metal material, a metal complex material may also be used.

Although the insulating layer 1 serving as an underlayer was formed of $SiO_2$ in the above embodiments, it is not particularly limited thereto and may include an SiOC film or SiCOH film, which is made of a low dielectric coefficient (low-k) material used for an interlayer insulating layer. Specifically, the underlayer may be at least one film selected from the group consisting of an $SiO_2$ film (including a thermal oxidation film and a plasma TEOS film), an SiOF film, an SiC film, an SiN film, an SiOC film, a SiCOH film, an SiCN film, a porous silica film, a porous methylsilsesquioxane film, a polyarylene film, a SiLK (registered trademark) film and a fluorocarbon film, or a laminated film including two or more thereof.

Although the transition metal was manganese in the above embodiments, the present invention is not particularly limited thereto and may use at least one transition metal selected from the group consisting of Nb, Zr, Cr, V, Y, Pd, Ni, Pt, Rh, Tc, Al, Mg, Sn, Ge, Ti and Re.

It should be understood that the film forming apparatus described above is preferably given for illustrative purpose. For instance, the resistance heater may be replaced by a heating lamp such as a halogen lamp, as a heating device required in the present invention. Further, a heat treating apparatus is not particularly limited to a single-wafer heat treating apparatus, but may be a batch type apparatus. The film forming method is not particularly limited to heat treatment (herein, a plasmaless thermal process) but may use a plasma assist type heat treatment. In this case, the plasma may be generated by applying high frequency power to two electrodes as required, wherein an upper electrode is the shower head 16 and a lower electrode is the mounting table 44. Further, an object to be treated is not particularly limited to a semiconductor wafer but may include other substrates, e.g., a glass substrate, a LCD substrate, a ceramic substrate, and the like.

In accordance with the embodiments of the present invention, a sufficiently thin and uniform self-aligned barrier film may be formed in recess, e.g., trenches and/or holes in different sizes formed in a semiconductor wafer by CVD or ALD. The present invention may be applied to a multilayered Cu wiring including a lower local wiring and an upper global wiring so as to enable miniaturization of the multilayered Cu wiring. Consequently, high speed and reliable electronic apparatuses may be manufactured by high speed semiconductor applications and miniaturization technologies.

While the invention has been shown and described with respect to the embodiments, it will be understood by those skilled in the art that various changes and modification may be made without departing from the scope of the invention as defined in the following claims.

What is claimed is:

1. A film forming method, comprising:
  forming a thin film of CuMn alloy on a surface of an object to be treated by a heat treatment by using an organic metal-containing source gas containing manganese (Mn), a copper-containing source gas and $H_2O$ (water vapor) in a vacuum-evacuable processing chamber, wherein the forming the thin film includes a first step including supplying the organic metal-containing source gas and thereafter supplying the $H_2O$ and a second step including supplying the copper-containing source gas and thereafter supplying the $H_2O$, wherein the first step and the second step are alternately repeated to form the thin film.

2. The film forming method of claim 1, wherein the object has a recess on a surface thereof and, after the thin film is formed by the heat treatment, a punch-through treatment is performed to remove the thin film present on a bottom of the recess.

3. The film forming method of claim 2, wherein the punch-through treatment is an etching process performed after the surface of the object excluding a part to be removed is covered with a resist.

4. The film forming method of claim 2, wherein the punch-through treatment is an etching process performed to entirely etch back the surface of the object.

5. The film forming method of claim 2, wherein the recess includes a groove and a hole formed on a bottom of the groove, and the thin film removed by the punch-through treatment is a thin film present on a bottom of the hole.

6. The film forming method of claim 1, wherein a copper film is deposited on the object having the thin film formed thereon by CVD to perform a burying process in the recess of the object.

7. The film forming method of claim 6, wherein the burying process is conducted in the processing chamber in which the thin film was formed.

8. The film forming method of claim 7, wherein an annealing process is performed on the object after the burying process.

9. The film forming method of claim 8, wherein the annealing process is performed in the processing chamber in which the burying process was conducted.

10. The film forming method of claim 1, wherein a copper film is deposited on the object having the thin film formed thereon by a plating method to perform a burying process in a recess of the object.

11. The film forming method of claim 10, wherein an annealing process is performed on the object after the burying process.

12. The film forming method of claim 1, wherein an underlayer of the thin film includes at least one from the group consisting of an $SiO_2$ film, an SiOF film, an SiC film, an SiN film, an SiOC film, a SiCOH film, an SiCN film, a porous silica film, a porous methylsilsesquioxane film, a polyarylene film, a SiLK (registered trademark) film and a fluorocarbon film.

13. The film forming method of claim 1, wherein the organic metal containing Mn is at least one selected from the group consisting of $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, $Mn(hfac)_2[=Mn(C_5HF_6O_2)_3]$, and $((CH_3)_5Cp)_2Mn[=Mn((CH_3)_5C_5H_4)_2]$.

14. The film forming method of claim 13, wherein a ratio (M1/M2) of a supply amount M1 of the organic metal-containing source gas containing Mn to a supply amount M2 of the $H_2O$ ranges from 0.001 to 50.

15. The film forming method of claim 1, wherein the heat treatment is conducted with a plasma.

16. A semiconductor device having a film structure formed by the film forming method described in claim 1.

17. An electronic apparatus including the semiconductor device having a film structure formed by the film forming method described in claim 1.

18. The thin film forming method of claim 1, wherein the first step includes a predetermined period of time separating the supplying of the organic metal-containing source gas and the supplying of the $H_2O$.

19. The thin film forming method of claim 18, wherein the second step includes a predetermined period of time separating the supplying of the copper-containing source gas and the supplying of the $H_2O$.

* * * * *